(12) United States Patent
Philippens et al.

(10) Patent No.: US 7,856,045 B2
(45) Date of Patent: Dec. 21, 2010

(54) SURFACE EMITTING SEMICONDUCTOR COMPONENT

(75) Inventors: Marc Philippens, Regensburg (DE);
Tony Albrecht, Bad Abbach (DE);
Martin Müller, Regenstauf (DE);
Wolfgang Schmid, Deuerling/Hillohe (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 357 days.

(21) Appl. No.: 11/634,708

(22) Filed: Dec. 5, 2006

(65) Prior Publication Data

US 2007/0145388 A1 Jun. 28, 2007

(30) Foreign Application Priority Data

Dec. 5, 2005 (DE) .................. 10 2005 058 010
Mar. 8, 2006 (DE) .................. 10 2006 010 727

(51) Int. Cl.
*H01S 5/187* (2006.01)
(52) U.S. Cl. .................. 372/96; 257/104; 257/80
(58) Field of Classification Search .................. 257/194, 257/80, 104; 372/96
See application file for complete search history.

(56) References Cited

U.S. PATENT DOCUMENTS

| 6,411,638 | B1 | 6/2002 | Johnson et al. | |
| 6,434,179 | B1 | 8/2002 | Ebeling | |
| 6,535,541 | B1 * | 3/2003 | Boucart et al. | 372/96 |
| 6,778,582 | B1 * | 8/2004 | Mooradian | 372/97 |
| 7,126,160 | B2 * | 10/2006 | Sun et al. | 257/98 |
| 2002/0146053 | A1 * | 10/2002 | Iwai | 372/75 |
| 2003/0076866 | A1 * | 4/2003 | Baillargeon et al. | 372/99 |
| 2006/0104327 | A1 | 5/2006 | Karnutsch et al. | |

FOREIGN PATENT DOCUMENTS

| DE | 102 41 192 A1 | 3/2004 |
| DE | 600 02 478 T2 | 3/2004 |
| DE | 103 17 970 A1 | 8/2004 |
| EP | 0 851 547 B1 | 12/1997 |
| EP | 1 051 783 B1 | 1/1999 |
| WO | WO 98/43329 | 10/1998 |
| WO | WO 2004/070900 A1 | 8/2004 |
| WO | WO 2005/048424 A1 | 5/2005 |

* cited by examiner

*Primary Examiner*—Marcos D Pizarro
*Assistant Examiner*—Tifney L Skyles
(74) *Attorney, Agent, or Firm*—Cohen Pontani Lieberman & Pavane LLP

(57) ABSTRACT

A surface emitting semiconductor component (1) with an emission direction which comprises a semiconductor body (2). The semiconductor body comprises a plurality of active regions (4a, 4b) which are suitable for the generation of radiation and are arranged in a manner spaced apart from one another, a frequency-selective element (6) being formed in the semiconductor body.

20 Claims, 4 Drawing Sheets

SURFACE EMITTING SEMICONDUCTOR COMPONENT

RELATED APPLICATIONS

This patent application claims the priority of German patent applications 10 2005 058 010.6 filed Dec. 5, 2005 and 10 2006 010 727.6 filed Mar. 8, 2006, the disclosure content of both of which is hereby incorporated by reference.

Field of the Invention

The present invention relates to a radiation-emitting semiconductor component, in particular a semiconductor laser component.

SUMMARY OF THE INVENTION

It is an object of the present invention to provide a radiation-emitting semiconductor component, in particular for a semiconductor laser component, having increased efficiency.

A radiation-emitting semiconductor component according to one embodiment of the invention is a surface emitting semiconductor component with an emission direction and comprises a semiconductor body comprising a plurality of active regions which are suitable for the generation of radiation and are arranged in a manner spaced apart from one another in the emission direction, a frequency-selective element being formed in the semiconductor body.

By means of the frequency-selective element, it is possible to influence the intensity distribution of radiation in the semiconductor body. The intensity distribution is preferably influenced in such a way that the intensity distribution, in particular the envelope curve thereof, is shaped in accordance with a predetermined intensity distribution or a predetermined curve. In particular, the intensity distribution may be influenced in such a way that the intensity which can be absorbed in an absorbent element that is not formed for the generation of radiation in the semiconductor body is reduced in comparison with a semiconductor body which is formed in identical fashion but in which the frequency-selective element is dispensed with. The radiation power absorbed in the semiconductor body can thus be reduced, as a result of which the coupled-out radiation power is increased.

By means of the plurality of active regions, it is possible to increase the radiation power generated in the semiconductor body and, by this means, advantageously likewise the radiation power coupled out from the semiconductor body. In particular, it is thus also possible to increase the radiation power coupled out from the semiconductor body relative to the area contained in a radiation coupling-out area of the semiconductor component.

Furthermore, in the case of the semiconductor component, on account of the plurality of active regions, the electrical resistance in the semiconductor body is distributed between a plurality of active regions, with the result that the resistance of the semiconductor body per active region is reduced in comparison with a semiconductor body comprising a smaller number of active regions. The resistance to be overcome by an operating current per active region can thus be reduced. The conversion efficiency of electrical power fed to the semiconductor body into radiation power is consequently increased.

Overall, the semiconductor component is accordingly distinguished by efficiency that can be increased in a simplified manner.

It is preferred to form two active regions for the generation of radiation having the same wavelength. This can be achieved in a simplified manner by identical type of embodiment of the active regions, e.g. by means of identical materials and/or the same structural construction of the active regions.

In one preferred configuration, between two active regions a tunnel junction is monolithically integrated in the semiconductor body, the two active regions being electrically conductively connected, in particular in series, by means of the tunnel junction during operation of the semiconductor component.

By means of the tunnel junction, it is possible to increase the conversion efficiency of charge carriers injected into the semiconductor body into radiation (photons) by means of the active regions electrically conductively connected via the tunnel junction. An electron that recombines with generation of radiation in one active region can tunnel through the tunnel junction, which is embodied for example as a tunnel diode that is reverse-biased particularly during operation of the semiconductor component in the forward direction with respect to the active regions, and can pass into the other active region.

The tunnel junction is preferably formed in such a way that electrons, after radioactive recombination, tunnel from the valence band of one active region into the conduction band of the other active region and can once again be utilized for the generation of radiation in the last-mentioned active region. A charge carrier can thus be utilized multiply, that is to say in a plurality of active regions, for the generation of radiation.

The tunnel junction preferably has two tunnel semiconductor layers of different conduction types. Furthermore, the tunnel junction is preferably arranged in the semiconductor body between two semiconductor layers of the semiconductor body of different conduction types, which particularly preferably adjoin the tunnel junction. The semiconductor layers of the tunnel junction preferably have a higher dopant concentration than the respective semiconductor layer of the semiconductor body of the respective same conduction type which adjoins the tunnel junction. Furthermore, the tunnel semiconductor layers of the tunnel junction preferably in each case adjoin a semiconductor layer of the semiconductor body which has the same conduction type as the adjoining tunnel layer.

In a further preferred configuration, the frequency-selective element is arranged between two active regions. The frequency-selective element is particularly preferably arranged between the active regions which are electrically conductively connected via the tunnel junction. In the region of the tunnel junction, the radiation intensity can thus be reduced in a simplified manner on account of the relative spatial proximity to the frequency-selective element. A tunnel junction generally has a high absorptivity for radiation generated in the semiconductor body, in particular by means of free charge carriers, so that a reduction of the intensity in the region of the tunnel junction by means of the frequency-selective element is particularly advantageous.

The frequency-selective element is preferably formed in such a way that the intensity of the generated radiation in the semiconductor body is reduced within the frequency-selective element. The tunnel junction is expediently surrounded by the frequency-selective element or embedded in the latter.

In a further preferred configuration, the semiconductor component has an internal resonator or is formed for operation with an external resonator. The semiconductor component is preferably formed for operation as an electrically pumped semiconductor laser component with a resonator. The semiconductor component is particularly preferably formed for operation as VCSEL (VCSEL: vertical cavity surface emitting laser) with an internal resonator.

During operation of the semiconductor component with resonator, a radiation field, in particular a field of standing waves (standing wave field) builds up in the resonator, and can be at least partly amplified by stimulated emission in the active regions. The amplified radiation can couple out from the resonator as coherent laser radiation.

In a further preferred configuration, the resonator is formed and preferably delimited by means of a first resonator mirror and a second resonator mirror. The first resonator mirror and/or the second resonator mirror may be embodied as a Bragg mirror (resonator Bragg mirror), in particular monolithically integrated in the semiconductor body.

Mirrors by means of which the resonator is formed are preferably formed with a high reflectivity, for example of 99% or greater, for instance 99.9% or greater, one of the mirrors serving as a coupling-out mirror for coupling out radiation from the resonator and, for this purpose, preferably having a correspondingly lower reflectivity. In this case, the reflectivity of the coupling-out mirror is expediently chosen with a magnitude such that laser activity can be achieved during operation of the component.

The resonator is preferably formed as a common resonator for a plurality of active regions, e.g. two or more active regions, which are in each case formed as amplifying regions for radiation in the semiconductor body and are arranged within the resonator common to said active regions. This preferably relates to the two active regions between which the frequency-selective element and/or the tunnel junction is arranged. The gain can be increased by means of a plurality of amplifying regions in a common resonator. A threshold current required for achieving the laser activity or a corresponding threshold current density can thereby advantageously be reduced. Furthermore, with the pump current remaining the same, it is possible to increase the radiation power generated in the semiconductor body.

The reflectivity of a resonator mirror may alternatively or supplementarily be reduced, in which case laser activity can still reliably be achieved despite the reduced reflectivity on account of the increased gain. In this case, the reflectivity of the coupling-out mirror is expediently reduced, so that the radiation power coupled out from the resonator can be increased without critically increasing the threshold current.

A pump current for electrically pumping the semiconductor component can flow through the first resonator mirror and/or the second resonator mirror. Preferably, at least one resonator mirror is doped, so that the pump current can be conducted via the doped resonator mirror with advantageously low resistance.

The electrical resistance in the resonator or in the semiconductor body, in particular that of a resonator mirror that conducts the pump current, is distributed between the active regions on account of the plurality of said active regions. The electrical resistance to be overcome by the pump current in the semiconductor body relative to the number of active regions is consequently reduced in comparison with a semiconductor component comprising a smaller number of active regions. The conversion efficiency is thus increased.

A Bragg mirror preferably comprises a plurality of layers stacked one on top of another, in particular semiconductor layers, having different refractive indexes. Said layers are preferably embodied in each case as a $\lambda/4$ layer for a radiation having the wavelength $\lambda$ that is to be emitted by the semiconductor component and is to be amplified in particular in the resonator.

For a Bragg mirror involved in forming the resonator, fifty or more layers, for example, may be necessary in order to ensure that the laser activity is achieved. The electrical resistance of a Bragg mirror generally increases with the number of layers on account of the rising number of interfaces. Therefore, a resonator mirror embodied as a Bragg mirror often has a comparatively high resistance. The resistance of a semiconductor component comprising a resonator Bragg mirror monolithically integrated into the semiconductor body may therefore be critically determined by the electrical resistance of said Bragg mirror that conducts the pump current. On account of the high resistance of the mirror, the required electrical pump power also increases accordingly in accordance with $P=RI^2$ with the electrical power P, the current I and the resistance R, since a critical power drops at the Bragg mirror. On account of the plurality of active regions to which a common pump current can be fed via the Bragg mirror, the resistance of the semiconductor component per active region is reduced, as a result of which the conversion efficiency can be increased.

In a further preferred configuration, the first resonator mirror and the second resonator mirror have one of the following configurations: identical conduction type, different conduction type. If the resonator mirrors have the same conduction type, then a conduction type that is advantageous for the semiconductor component is expediently chosen. In n-conducting semiconductor materials, the absorption of radiation generated in the semiconductor body at free charge carriers is generally—compared with p-conducting semiconductor materials—advantageously low. Therefore, both resonator mirrors are preferably embodied in n-conducting fashion and in particular as Bragg mirrors.

In an advantageous development, an, if appropriate additional, tunnel junction is monolithically integrated in the semiconductor body between a resonator mirror and the active region closest to the latter. This facilitates the use of two resonator Bragg mirrors of identical conduction type without critically impeding the current supply to the active regions on account of a critically blocking pn junction that is otherwise formed.

In comparison with resonator Bragg mirrors of identical conduction type, a semiconductor body comprising monolithically integrated resonator Bragg mirrors of different conduction types can be manufactured in a simplified manner and in particular for the most part in standard fashion.

In a further preferred configuration, two active regions comprise a quantum well structure. A single or multiple quantum well structure is distinguished by particularly high internal quantum efficiency in the generation of radiation in the respective active region. In this case, the designation quantum well structure does not comprise any indication about the dimensionality of the quantization. It therefore encompasses, inter alia, quantum wells, quantum wires and quantum dots and any combination of these structures.

In a further preferred configuration, the semiconductor body is formed in such a way that the radiation field which forms within the resonator during operation of the semiconductor component and is to be amplified in particular in the semiconductor body has an intensity minimum (intensity node) within the tunnel junction which electrically conductively connects the two active regions of the semiconductor body, in particular in series. This preferably relates to a, preferably predetermined, mode of the standing wave field that is to be amplified.

As an alternative or in addition, the semiconductor body may be formed correspondingly for the tunnel junction connected downstream of a Bragg mirror, as described above. An intensity minimum of the standing wave field may thus be arranged in this, if appropriate additional, tunnel junction as well.

On account of the radiation intensity reduced by means of the frequency-selective element in the region of the tunnel junction, only a comparatively low radiation power can be absorbed in the tunnel junction. Even in the event of forming the tunnel junction in the semiconductor body slightly outside an intensity minimum of the standing wave field, the radiation power that can be absorbed in the tunnel junction can thereby be kept within a tenable scope in a simplified manner without significantly impairing the efficiency or the laser properties of the semiconductor component. It is thus possible, by way of example, for the threshold current to be kept comparatively low in a simplified manner despite an absorbent tunnel junction that electrically couples the active regions to one another.

In the arrangement of the tunnel junction or the production of the semiconductor body, which is preferably grown epitaxially on a growth substrate, the manufacturing tolerance is thus increased on account of the intensity modulation by means of the frequency-selective element without the efficiency being critically reduced. A deviation from the arrangement of the tunnel junction around an intensity node leads, in particular, only to a moderate increase in the absorbed radiation power.

In a further preferred configuration, the frequency-selective element comprises a Bragg mirror and particularly preferably a further Bragg mirror. The semiconductor body may therefore comprise, in particular, in addition to a (the) resonator Bragg mirror(s), a further Bragg mirror, which is preferably embodied as a Bragg mirror monolithically integrated in the semiconductor body. The Bragg mirror(s) of the frequency-selective element is (are) preferably arranged between two active regions of the semiconductor body.

The frequency-selective element is preferably free of an active region, so that preferably no active region is arranged in particular between the Bragg mirrors of the frequency-selective element.

By means of the frequency-selective element, additional phase conditions are created for the radiation field within the resonator, in particular by means of reflection at the Bragg mirrors. The intensity of the standing wave field in the resonator can be reduced in a simplified manner between the Bragg mirrors of the frequency-selective element. In particular, this relates to a lowering of the envelope curve of the intensity distribution of the standing wave field in the semiconductor body within the frequency-selective element in comparison with a semiconductor body without a frequency-selective element.

The envelope curve of the intensity distribution of the radiation field can thus be shaped and modified in a targeted manner by means of the frequency-selective element. The envelope curve of the intensity distribution, in particular of an, e.g. longitudinal, mode to be amplified in the resonator, may be shaped in such a way that it has a local minimum between the active regions—in particular those between which the frequency-selective element is arranged-, within the frequency-selective element, between the Bragg mirrors of the element and/or in the region of the tunnel junction.

As an alternative or in addition, a local maximum of the envelope curve can be shifted in a targeted manner, e.g. to outside the region between two active regions, by means of the frequency-selective element.

As an alternative or in addition, the frequency-selective element may be formed for, in particular longitudinal, mode selection. This makes it possible to simplify the selection of a predetermined mode to be amplified in the resonator. In this case, the frequency-selective element preferably increases the losses for modes that are not to be amplified in the resonator. A longitudinally single mode operation of the semiconductor component can thus be achieved in a simplified manner.

The frequency-selective element is preferably formed in such a way as to avoid the formation of a subresonator, that is to say a separate resonator for an active region of a pair of active regions, in the semiconductor component. For this purpose, the Bragg mirror(s) of the frequency-selective element is (are) expediently formed, for the radiation having the wavelength $\lambda$ that is to be amplified in the resonator, with reflectivities low enough to avoid a build-up of oscillations of modes which are not associated with the common resonator.

A reflectivity of 95% or less, preferably 90% or less, particularly preferably 80% or less, is particularly suitable for this purpose. The reflectivity of the Bragg mirror and/or of the further Bragg mirror is furthermore preferably greater than 30%, particularly preferably greater than 40%. Such reflectivities are particularly suitable for the intensity modulation. The lower the reflectivity of the individual mirrors for the generated radiation, the lower, too, the risk, of the build-up of oscillations of subresonator modes. The greater the reflectivity, however, the better it is possible to influence the intensity distribution.

In a further preferred configuration, the tunnel junction that electrically conductively connects the two active regions is arranged between the two Bragg mirrors of the frequency-selective element. Preferably, tunnel semiconductor layers of the tunnel junction in each case adjoin the layers of the corresponding Bragg mirror.

Furthermore, the Bragg mirrors of the frequency-selective element preferably have different conduction types. The frequency-selective element may, in particular, be monolithically integrated in the semiconductor body. Structural modifications at the frequency-selective element are advantageously not necessary after the growth of layers for Bragg mirrors of the frequency-selective element for the frequency selection.

In a further preferred configuration, a current constriction element is formed between two active regions, preferably in a manner integrated in the frequency-selective element, particularly preferably in a manner integrated in a Bragg mirror of the frequency-selective element. The current flow in the semiconductor body can be guided by means of an electrically insulating current blocking region of the current constriction element laterally in the direction of an electrically conductive, current-carrying aperture of the current constriction element and can be conducted in the vertical direction through said aperture. By means of the current constriction element, the current flow is concentrated in the lateral direction and, in particular, the current path is constricted. The charge carrier flow between the active regions can be constricted by means of the current constriction element in the lateral direction, thereby preventing the current spreading between the active regions. The current density in the semiconductor body can be increased by constriction by means of the current constriction element, as a result of which a threshold current density required for achieving the laser activity can be achieved in a simplified manner.

Preferably, the current constriction element is integrated in a p-conducting semiconductor region of the semiconductor body, e.g. in a p-conducting Bragg mirror of the frequency-selective element. In the case of conventional semiconductor laser components, a current constriction element is often formed within a p-conducting semiconductor region, in particular a p-conducting resonator Bragg mirror. The integration of an additional current constriction element in a semiconductor region between the active regions, in particular a p-conducting Bragg mirror of the frequency-selective element, can thus be realized in a simplified manner in the same material surrounding, that is to say in layers having an identical composition and/or doping, as the current constriction element that is provided in the semiconductor body anyway. Since a current constriction element is often formed as an oxide constriction element by means of lateral oxidation of a semiconductor layer, it is thus possible to form, in a simplified manner, two current constriction elements with a current-conducting aperture of identical size.

In a further preferred configuration, the semiconductor body is formed in such a way that an active region is arranged in a targeted manner outside an intensity maximum of the radiation field in the resonator in such a way that said intensity maximum lies within an n-conducting semiconductor region of the semiconductor body, which preferably adjoins the active region, or is shifted in the direction thereof. This can be achieved by forming the semiconductor body in a suitable manner. The intensity maximum is preferably the intensity maximum closest to the active region, in particular of a mode that is to be amplified in the active regions.

In a further preferred configuration, the semiconductor body, in particular the tunnel junction, the active regions and/or the frequency-selective element, contains a III-V semiconductor material, in particular a material from the III-V semiconductor material systems $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$ and/or a material from the semiconductor material systems InGaAsN, InGaAsSb, InGaAsSbN or $In_xGa_{1-x}As_yP_{1-y}$, where $0 \leq x \leq 1$, $0 \leq y \leq 1$, where in each case $x \neq 0$ and/or $y \neq 0$ preferably holds true for the specified parameters x and y. It is furthermore preferably the case that $x \neq 1$ and/or $y \neq 1$. III-V semiconductor materials may be distinguished by particularly high quantum efficiencies in the generation of radiation and simplified producibility of a semiconductor body for the semiconductor component. With the material systems mentioned, radiation in different spectral ranges can be generated particularly efficiently. In this case, $In_xGa_yAl_{1-x-y}N$ is particularly suitable for ultraviolet radiation, through blue to green radiation, $In_xGa_yAl_{1-x-y}P$ is particularly suitable for yellow to red radiation, and $In_xGa_yAl_{1-x-y}As$ is particularly suitable for infrared radiation.

BRIEF DESCRIPTION OF THE DRAWINGS

Further features, advantageous configurations and expediencies of the invention emerge from the following description of the exemplary embodiments in conjunction with the figures.

DETAILED DESCRIPTION OF THE DRAWINGS

Figure 1:
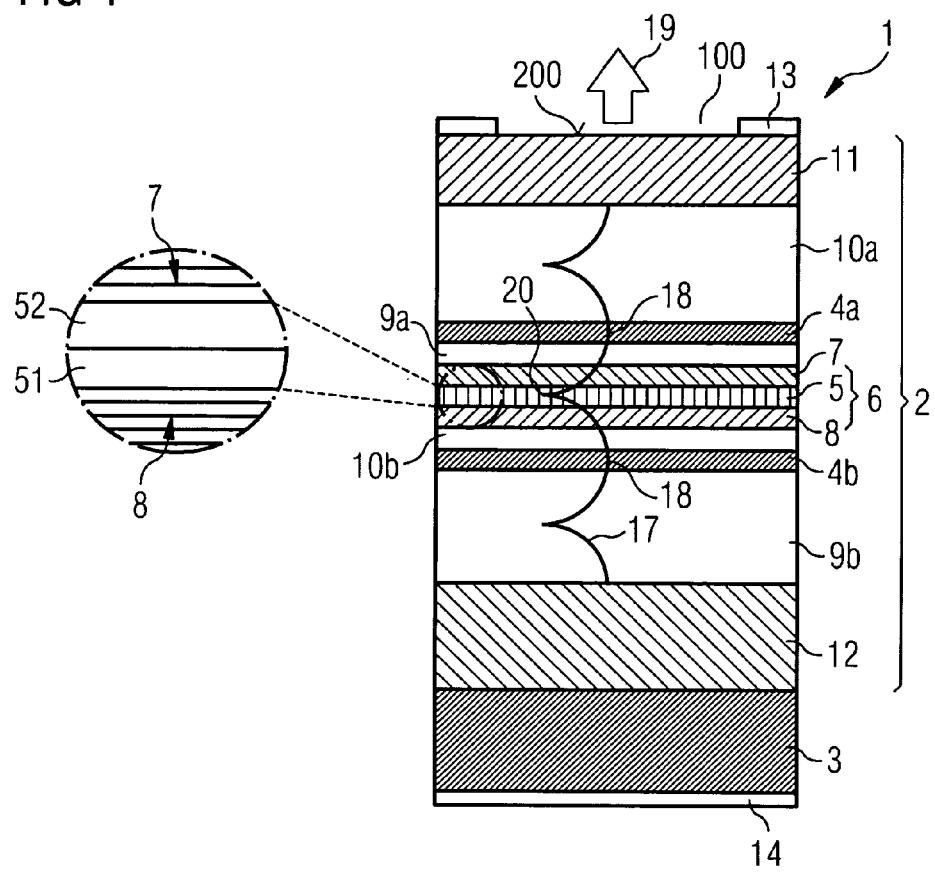
FIG. 1 shows a schematic sectional view of a first exemplary embodiment of a semiconductor component according to the invention.

Elements which are identical, of identical type and act identically are provided with identical reference numerals in the figures.

FIG. 1 shows a schematic sectional view of a first exemplary embodiment of a semiconductor component according to the invention.

The radiation-emitting semiconductor component 1 is embodied as an electrically pumped semiconductor laser component, in particular as a VCSEL with an internal resonator. The semiconductor component 1 comprises a semiconductor body 2 arranged on a substrate 3, which advantageously mechanically stabilizes the semiconductor body. The semiconductor body 2 is preferably embodied in monolithically integrated fashion and is particularly preferably grown epitaxially on the substrate 3, which then comprises the growth substrate or is formed from the latter.

The semiconductor body 2 comprises two active regions 4a and 4b suitable for generation of electroluminescent radiation. Said active regions are arranged in a manner spaced apart from one another and preferably in a manner adjacent to one another in the semiconductor body. The active regions 4a and 4b are electrically conductively connected in series via a tunnel junction 5 that is arranged and formed between said active regions in the semiconductor body. The tunnel junction 5 is embedded in a frequency-selective element 6 arranged between the active regions 4a and 4b and, in particular, is surrounded by the frequency-selective element.

The frequency-selective element 6 comprises a first Bragg mirror 7 and a second Bragg mirror 8, which are arranged between the active regions 4a and 4b in the semiconductor body 2 and are preferably monolithically integrated in the semiconductor body. The tunnel junction 5 is arranged in particular between the Bragg mirrors 7 and 8 of the frequency-selective element and is likewise preferably implemented in a manner monolithically integrated into the semiconductor body. There is preferably no active region arranged within the frequency-selective element and in particular between the Bragg mirrors 7 and 8 of the frequency-selective element 6.

The active regions 4a and 4b are in each case arranged between two semiconductor regions—the semiconductor regions 9a and 10a in the case of the active region 4a and, respectively, the semiconductor regions 9b and 10b in the case of the active region 4b—, the semiconductor regions that surround an active region preferably having, in particular in each case, different conduction types—n-conducting or p-conducting. The semiconductor regions are expediently correspondingly doped for this purpose.

The semiconductor regions arranged on the corresponding, in particular the same, side of the respective active region preferably have the same conduction type. In particular, the semiconductor regions 9a and 9b, e.g. n-conducting, and, respectively, the semiconductor regions 10a and 10b, e.g. p-conducting, preferably have the same conduction types in each case.

A resonator of the semiconductor component 1 is formed by means of a first resonator end mirror 11 and a second resonator end mirror 12, between which the two active regions 4a and 4b are arranged and which preferably delimit the resonator. The resonator end mirrors are preferably applied on the active regions, whereby an internal resonator, in particular, is formed.

The first resonator end mirror 11 and/or the second resonator end mirror 12 is preferably formed as a resonator Bragg mirror monolithically integrated in the semiconductor body 2, and the first resonator end mirror and/or the second resonator end mirror is particularly preferably doped. The respective doped resonator Bragg mirror preferably has the same conduction type as a semiconductor region arranged between the respective resonator Bragg mirror and the closest active region. Accordingly, the first resonator end mirror 11 is preferably embodied in p-conducting fashion (corresponding to the semiconductor region 10a) and the second resonator end mirror 12 is preferably embodied in n-conducting fashion (corresponding to the semiconductor region 9b).

Furthermore, the first Bragg mirror 7 and/or the second Bragg mirror 8 of the frequency-selective element 6 is preferably doped. The first Bragg mirror 7 preferably has the same conduction type as the semiconductor region 9a adjoining the Bragg mirror, in particular on that side of the Bragg mirror 7 which is remote from the tunnel junction 5. The same correspondingly holds true for the second Bragg mirror 8 of the frequency-selective element 6 with respect to the semiconductor region 10b, which is arranged in particular between the two active regions. Accordingly, the first Bragg mirror 7 is preferably embodied in n-conducting fashion and the second Bragg mirror 8 is preferably embodied in p-conducting fashion.

The active regions 4a and 4b are electrically conductively connected to one another via the frequency-selective element 6 and the tunnel junction 5 arranged between the active regions, and furthermore to a first contact 13 and also a second contact 14 of the semiconductor component 1. Via the contacts 13 and 14, charge carriers can be injected into the semiconductor body 2 during operation of the semiconductor component, which charge carriers can recombine with generation of radiation in the active regions 4a and 4b.

The first contact 13, e.g. a contact metallization, is preferably arranged on that side of the semiconductor body 2 which is remote from the substrate 3, and if, as in the case of a top emitter illustrated, an emission surface 200 of the semiconductor body 2 is arranged on that side of the semiconductor body which is remote from the substrate 3, the first contact is expediently cut out for the passage of radiation and embodied e.g. as a ring contact. The second contact 14, e.g. a contact metallization, is preferably arranged on that side of the substrate 3 which is remote from the semiconductor body 2. For current conduction, the substrate 3 is preferably embodied in electrically conductive fashion, e.g. by means of corresponding doping.

An aperture 100 of the ring contact for the passage of radiation may be embodied like a circle or like an ellipse in plan view of the emission surface 200 of the semiconductor body 2. An embodiment like an ellipse is particularly suitable for influencing the polarization for a radiation 19, e.g. infrared radiation, emerging from the semiconductor body 2.

Charge carriers which recombine radiatively in one of the active regions can pass into the other active region after tunneling through the tunnel junction 5. The tunnel junction 5 is preferably formed in such a way that after the recombination in one active region, charge carriers tunnel from the valence band of said active region into the conduction band of the other active region and once again recombine radiatively in the latter. The conversion efficiency of the semiconductor component in the conversion of electrical power into radiation power is thus advantageously increased since a charge carrier can be utilized multiply, that is to say in a plurality of active regions, for the generation of radiation.

In the resonator, a radiation field of standing waves (standing wave field) builds up by means of reflection at the resonator end mirrors. Said radiation field, in particular a mode of the field, can be amplified by stimulated emission in the active regions 4a and 4b. The amplified coherent laser radiation 19 can couple out from the resonator via a resonator end mirror serving as a coupling-out mirror, the resonator end mirror 11 in the present case, from the semiconductor body 2 of the semiconductor component 1 in the vertical direction, that is to say perpendicular to a lateral main area of the active regions, which are preferably arranged parallel to one another.

The semiconductor body 2 of the semiconductor component 1 is preferably based on (In, Al)GaAs, particularly preferably on (Al)GaAs. Materials of this type are particularly suitable for efficient generation of radiation, in particular infrared radiation. Infrared radiation is particularly suitable for data transmission, for which purpose the semiconductor component is preferably provided.

The resonator end mirrors 11 and 12 preferably have a high reflectivity, e.g. of 97% or greater, in particular 99% or greater, for instance 99.9%, for radiation having the wavelength $\lambda$ that is to be amplified in the active regions. The reflectivity of a resonator mirror serving as a coupling-out mirror is preferably lower than that of the further resonator mirror, the second resonator end mirror 12 in the present case.

A Bragg mirror of the semiconductor component—the first resonator Bragg mirror 11, the second resonator Bragg mirror 12, the first Bragg mirror 7 of the frequency-selective element and/or the second Bragg mirror 8 of the frequency-selective element 6—preferably has a multiplicity of semiconductor layers, for example 55 or more semiconductor layers for a resonator end mirror, having different refractive indexes. These are preferably based on (Al)GaAs in each case. Such a high number of layers is often necessary for obtaining a predetermined reflectivity, in particular of the resonator end mirrors 11 and/or 12, which suffices for achieving the laser activity, e.g. of 99.8% or greater. The semiconductor layers of a Bragg mirror of the semiconductor component are furthermore preferably embodied in each case as $\lambda/4$ layers for radiation having the wavelength $\lambda$ that is to be amplified in the active regions 4a and 4b.

In order to reduce the number of layers in a Bragg mirror with the reflectivity remaining the same, materials having advantageously a high refractive index difference, for instance AlAs and GaAs, are preferably used for the various semiconductor layers of the Bragg mirror. The electrical resistance of the Bragg mirror can thus advantageously be kept low on account of the comparatively small number of layers. The Bragg mirror may comprise semiconductor layer pairs comprising individual layers having different refractive indexes which are arranged alternately in such a way that a layer having a high refractive index is followed by a layer having a low refractive index. It is possible alternatively or supplementarily to use mirror structures in which one or a plurality of $\lambda/4$ layers have a material gradient, for example a gradient in the Al content.

The pump current for electrically pumping the semiconductor component is injected into the semiconductor body via the contacts 13, 14, the resonator end mirrors 11 and 12 and preferably the substrate 3.

On account of the multiplicity of layers, resonator Bragg mirrors 11 and 12 make a high contribution to the total electrical resistance of the semiconductor body 2. Since the resistance of said Bragg mirrors is distributed between the active regions on account of the plurality of said active regions, the conversion efficiency of the semiconductor component 1 of electrical power into radiation power can be increased in comparison with a component comprising only one active region in the semiconductor body.

Alternatively or supplementarily, it is also possible for the pump current not to be conducted via the resonator Bragg mirror 11 and/or 12 or the substrate 3 to the active regions. For this purpose there is one or a plurality of so-called intra-cavity contacts, that is to say a contact by means of which current is injected into the semiconductor body within the resonator, in particular between a resonator end mirror and the active region closest to the latter. The resistance to be overcome by the pump current can thus be reduced. A resonator end mirror downstream of which the intra-cavity contact is arranged may then be embodied as an undoped Bragg mirror, if appropriate. As an alternative, it is also possible to use an electrically insulating dielectric mirror layer stack, which is preferably formed on the semiconductor body, as resonator end mirror.

The tunnel junction 5 is preferably embodied as a diode that is reverse-biased during operation of the semiconductor component in the forward direction for the active regions 4a and 4b, in particular with respect to the contacts 13 and 14.

The tunnel junction comprises, by way of example, two tunnel layers 51 and 52 of different conduction types. The tunnel layer 52 preferably has the same conduction type, in particular n-conducting, as a semiconductor layer of the Bragg mirror 7, which semiconductor layer adjoins the tunnel junction 5 on the side of the tunnel layer 52, that is to say at that side of the tunnel layer 52 which is remote from the tunnel layer 51. The tunnel layer 52 particularly preferably has a higher dopant concentration (e.g. n$^+$) than said adjoining semiconductor layer. The same correspondingly holds true for the tunnel layer 51 (e.g. p$^+$) with respect to an, in particular p-conducting, semiconductor layer of the Bragg mirror 8 of the frequency-selective element, which semiconductor layer adjoins the tunnel junction 5 on the side of said tunnel layer 51.

The tunnel layers 51 and 52 preferably each have a thickness of 30 nm or less, particularly preferably 20 nm or less. The tunnel layers 51 and 52 may have a dopant concentration of, for example, $5\times10^{19}$ cm$^{-3}$ or more, preferably of $1\times10^{20}$ cm$^{-3}$ or more. (Al)GaAs layers having an Al content of 20% or less are particularly suitable for the respective tunnel layer.

The resonator length is preferably n*(λ/2), where λ denotes the wavelength of the radiation to be amplified in the resonator and n denotes a natural number. n is preferably greater than or equal to 3. n is furthermore preferably chosen in such a way that the resonator length is less than or equal to 6λ per active region of the semiconductor component.

The elements of the semiconductor body 2 that are arranged within the resonator, that is to say all the semiconductor elements apart from the resonator end mirrors, may have—apart from the active regions 4a and 4b—the same material composition apart from, if appropriate, different conduction types and/or dopant concentrations. In particular, the tunnel junction 5 and the adjoining semiconductor elements may have the same composition apart from the dopant concentration. Refractive index discontinuities within said elements in the common resonator with accompanying increased reflection at interfaces can thus be reduced.

As an alternative, different materials may in each case be used for the elements arranged within the resonator, that is to say in particular for the tunnel junction and the adjoining semiconductor elements. The degrees of freedom for the formation of these elements are thus increased.

Combinations of such identical type of formation and different formation of the individual semiconductor elements in the resonator are also possible. By way of example, all the elements between the resonator end mirror 12 and the tunnel junction 5, if appropriate including the tunnel junction, apart from the active region arranged there, may have the same material composition. The elements of the semiconductor body 2 arranged between the tunnel junction 5 and the resonator end mirror 11 may have different material compositions.

Furthermore, the active regions are preferably formed in identical fashion, in particular with identical materials and/or the same structural construction. The active regions are preferably embodied for generating radiation having the same wavelength.

The active regions furthermore preferably each comprise a single or multiple quantum well structure. These structures are distinguished by particularly high internal quantum efficiencies in the conversion of electrical power into radiation power. The radiation gain in the semiconductor body relative to the charge carrier density can thus be increased in a simplified manner.

The semiconductor body is furthermore preferably formed in such a way that an intensity maximum (intensity antinode) 18 of an intensity distribution of the radiation field that forms in the resonator and is to be amplified in the active regions, in particular of a predetermined mode of said radiation field, is in each case arranged in the active region 4a and 4b, respectively. The intensity distribution 17 in the resonator is illustrated only schematically and in normalized fashion in FIG. 1.

As an alternative or in addition, one or a plurality of active regions may also be arranged in a targeted manner outside an intensity antinode. For this purpose, it is possible to reduce the thickness of a p-conducting region in regions of comparatively high radiation intensity in the semiconductor body, and to correspondingly increase the thickness of an n-conducting region, in particular for a predetermined resonator length. In a p-conducting region, the absorption of radiation by free charge carriers is often particularly great and in particular greater than in an n-conducting region. This holds true in particular in the AlGaAs material system.

The respective active region is preferably arranged offset with respect to the closest intensity antinode in such a way that this is shifted in the direction of an n-conducting semiconductor region or lies in the latter. For this purpose, an if appropriate additional n-conducting region, e.g. the Bragg mirror 7 or the semiconductor region 9a, can be made correspondingly thicker. By this means, too, the efficiency of the semiconductor component can advantageously be increased despite the arrangement of the active region outside an intensity antinode, since radiation in the resonator has a shorter passage through p-conducting semiconductor material.

The semiconductor body 2 is furthermore preferably formed in such a way that an intensity node 20 of the intensity distribution 17 is arranged within the tunnel junction 5. The absorption of radiation by free charge carriers in the tunnel junction 5, which in this respect generally exhibits a comparatively high absorptivity, can thus be reduced. The conversion efficiency and in particular also the radiation power coupled out via the emission surface 200 is thereby increased in a simplified manner.

Furthermore, the differential efficiency $dP_{opt}/dI$, with the coupled-out radiation power $P_{opt}$ and the injected current I, and/or the differential gain $dg/dn$, with the gain g and the charge carrier density n, is advantageously increased.

By means of the Bragg mirrors 7 and 8 of the frequency-selective element 6, additional phase conditions are created in the resonator by reflection in the semiconductor body. The Bragg mirrors are preferably formed in such a way that the intensity is reduced within the frequency-selective element and thus also in the region of the tunnel junction. In particular, an envelope curve of the intensity distribution of the field of standing waves in the semiconductor body can be shaped by means of the frequency-selective element in such a way that said envelope curve has a local minimum within the frequency-selective element, in particular between the Bragg mirrors of the element. The tunnel junction is preferably arranged in the semiconductor body in such a way that it is arranged in a vicinity of the local minimum generated by means of the frequency-selective element, in particular between two local maxima, of the envelope curve of the intensity distribution 17 in the semiconductor body 2. The tunnel junction is preferably arranged in such a way that the local minimum of the envelope curve lies in the tunnel junction. The manufacturing tolerances in the formation of the tunnel junction are increased in this way since even in the case of a small deviation of the arrangement of the tunnel junction from the optimum arrangement in an intensity node, the radiation power that can be absorbed in the tunnel junction is advantageously low on account of the modulated intensity distribution. A reflectivity of the Bragg mirrors 7 and 8 of 30% or more, preferably of 40% or more, for radiation having the wavelength λ that is to be amplified in the resonator is particularly suitable for intensity modulation.

The Bragg mirrors 7 and 8 of the frequency-selective element preferably have a reflectivity of 95% or less, or 90% or less, particularly preferably of 80% or less, for the radiation to be amplified in the active regions 4a and 4b. The build-up of oscillations of laser submodes in subresonators between the Bragg mirror 7 and the resonator end mirror 11, or the Bragg mirror 8 and the resonator end mirror 12, can thus be prevented.

The resonator is accordingly formed in particular as a common resonator for the active regions 4a and 4b and not as an arrangement of separate resonators one above another. A disadvantageous influence of the Bragg mirrors of the frequency-selective element on the laser properties of the semiconductor component can thus be avoided.

The individual layers of the respective Bragg mirror of the frequency-selective element may alternatively or supplementarily also be formed as $\lambda_1/4$ layers for radiation having a wavelength $\lambda_1$, which deviates from the wavelength λ of the radiation which is to be amplified by means of the resonator and for which the resonator end mirrors are expediently formed in highly reflective fashion. This deviation may amount to up to 10%.

Furthermore, the frequency-selective element may alternatively or additionally be formed, for instance as an etalon-like element monolithically integrated into the semiconductor body, for longitudinal mode selection. A longitudinally single mode operation of the semiconductor component is thus facilitated.

Figure 2:
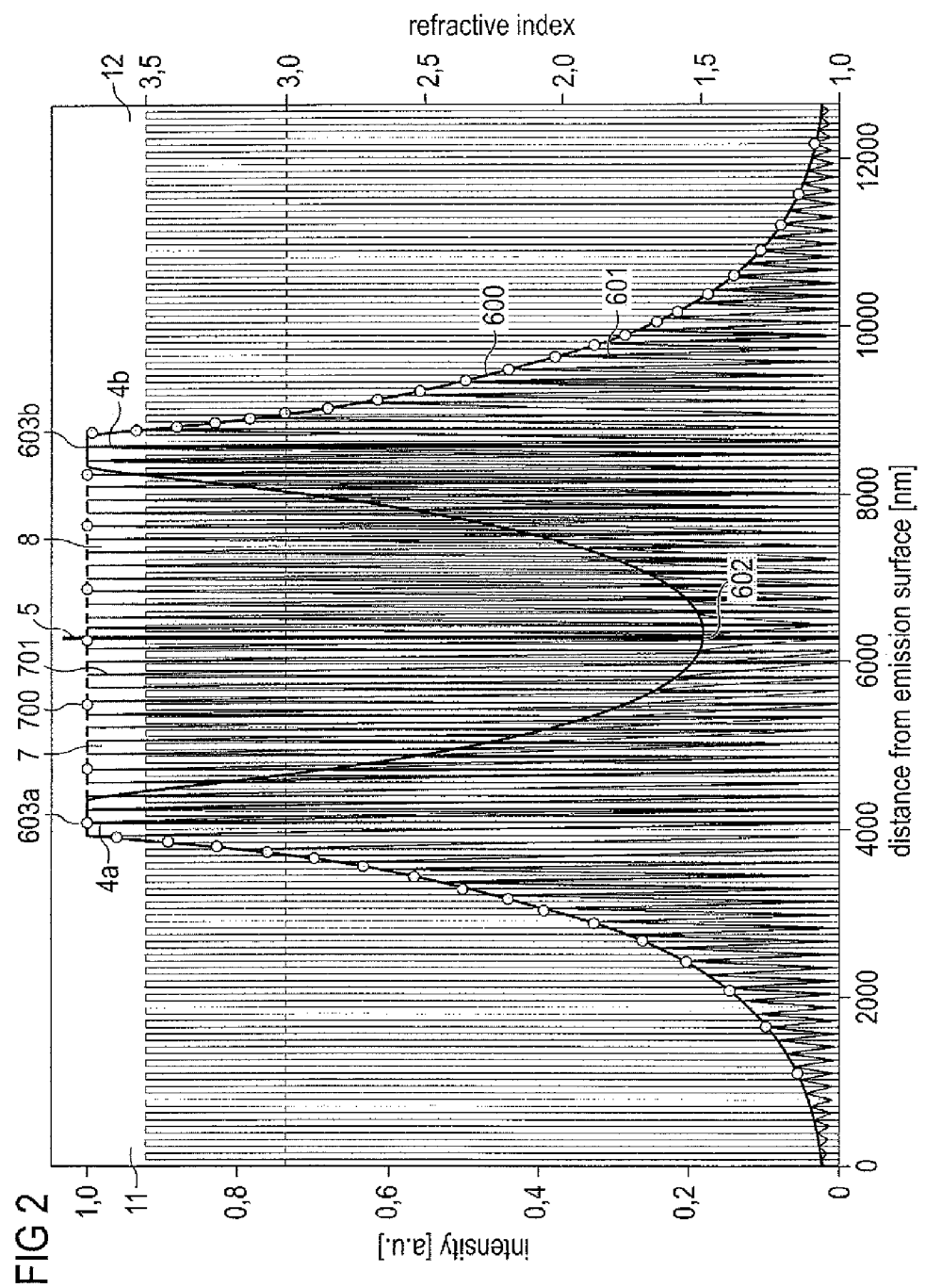
FIG. 2 shows simulation results for part of the intensity profile in a semiconductor body of a semiconductor component according to the invention.

FIG. 2 shows a simulation for part of the intensity profile of the envelope curve of a longitudinal mode—that is to be amplified in particular in the resonator—of the field of standing waves in the semiconductor body as a function of the distance from the emission surface 200 for a semiconductor body comprising a frequency-selective element (curve 600) and a corresponding semiconductor body without a frequency-selective element 6 (curve 700). The intensity distribution 601 and 701 of the mode of the field of standing waves in the semiconductor body which determines the respective envelope curve 600 and 700 is in each case also illustrated for the curves 600 and 700, respectively. The refractive indexes of those individual layers of the semiconductor body on which the simulation is based, at the respective distance from the emission surface, are furthermore indicated schematically.

The simulation was based on a sequence of 25 semiconductor layer pairs for the resonator Bragg mirror 12, layers for the active region 4b, 13 semiconductor layer pairs for the Bragg mirror 8 of the frequency-selective element, 13 semiconductor layer pairs for the Bragg mirror 7 of the frequency-selective element, layers for the active region 4a and 25 semiconductor layer pairs for the resonator Bragg mirror 11. The individual layers of the semiconductor layer pairs of the respective Bragg mirror each have the same refractive index difference of 0.5 (=3.5—3.0).

The active regions 4a and 4b are in each case arranged in the region of a local maximum 603a and 603b, respectively, of the envelope curve 600 of the intensity distribution 601 and in particular at a maximum of the field of standing waves 601. The tunnel junction 5 is arranged around a local minimum 602 of the curve 600 between the active regions 4a and 4b. According to the curve 700 identified by dashed lines and with circles, a semiconductor body without a frequency-selective element has no local minimum between the active regions. Rather, the tunnel junction would be arranged at a maximum of the envelope curve 700 of the corresponding intensity distribution 701 of the standing wave field which runs between the active regions 4a and 4b and, particularly, extends from the active region 4a as far as the active region 4b. The radiation power available for absorption in the tunnel junction can thus be reduced by means of the frequency-selective element, as a result of which the conversion efficiency and, in particular, also the radiation power coupled out from the semiconductor component can be increased.

Figure 3:
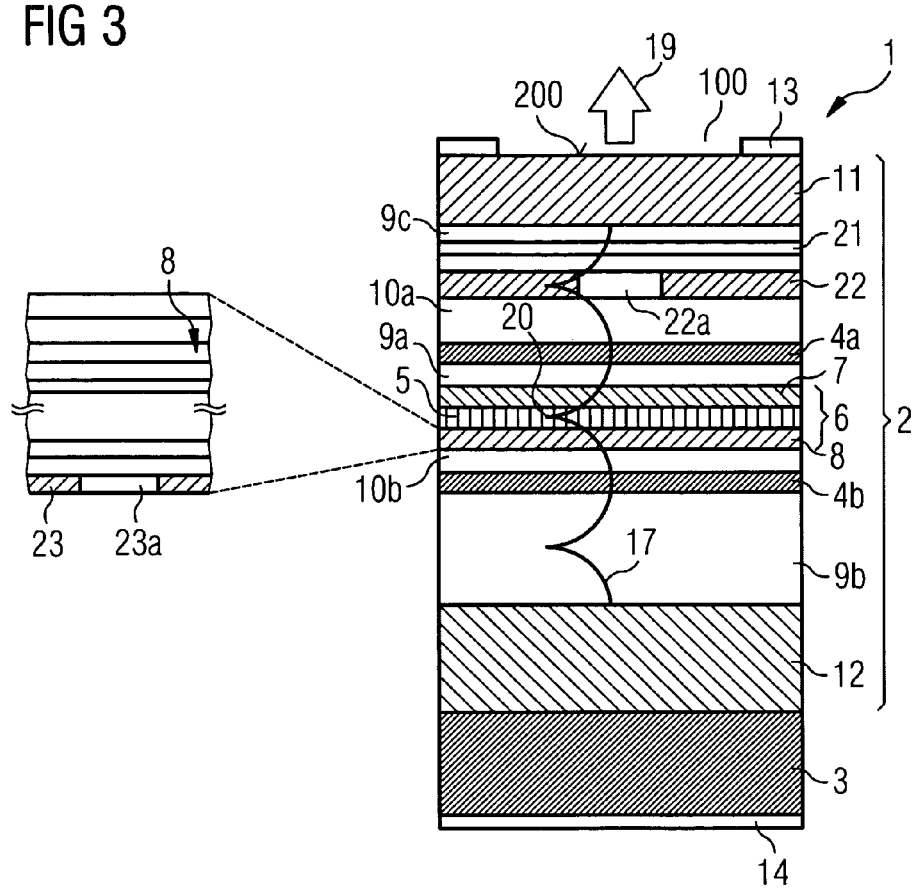
FIG. 3 shows a schematic sectional view of a second exemplary embodiment of a semiconductor component according to the invention.

FIG. 3 shows a schematic sectional view of a second exemplary embodiment of a semiconductor component 1 according to the invention. The semiconductor component shown in FIG. 3 essentially corresponds to the semiconductor component described in connection with FIGS. 1 and 2. In contrast thereto, the semiconductor component has a further tunnel junction 21, a current constriction element 23 and a further current constriction element 22.

The current constriction element 23 is integrated in the, preferably p-conducting, Bragg mirror 8 of the frequency-selective element 6, which is arranged on that side of the tunnel junction which is remote from the emission surface 200, and is arranged between the active regions 4a and 4b. The current constriction element 23 is preferably formed in a layer terminating the Bragg mirror 8 on the side remote from the tunnel junction 5.

The further current constriction element 22 is integrated in a semiconductor layer of the, e.g. p-conducting, semiconductor region 10a arranged between the first contact 13, in particular the emission surface 200, and the closest active region 4a.

The current constriction elements 22 and 23 are preferably embodied as an oxide constriction element in each case. For this purpose, by way of example, an (Al)GaAs layer having a high aluminum content, preferably 80% or greater, is oxidized laterally, with the result that a non-oxidized region (cf. the current-carrying apertures 22a and 23a in the respective current constriction element) having a high conductivity is formed in a central region and an, in particular annular, oxidized region having a low conductivity is formed in the edge region of the semiconductor body 2. The current flow in the semiconductor body can be concentrated on the central region of the semiconductor body by means of the current constriction elements, as a result of which a threshold current density is achieved in a simplified manner and there is also a reduction of the risk of nonradiative recombination in edge regions of the semiconductor body.

By means of two current constriction elements on respectively different sides of an active region, it is possible to efficiently constrict both the current path in the semiconductor body for the supply conduction from the contact 13 to the active region 4*a* by means of the current constriction element 22*a*, and the current path between the active regions 4*a* and 4*b*. Lateral current spreading between the active regions can be prevented in particular by means of the current constriction element 23. For the simplified formation of apertures of identical size that mutually overlap one another, the layers in which the current constriction elements are respectively formed preferably have the same composition, the same conduction type and/or the same thickness.

Instead of decreasing the electrical conductivity of a semiconductor material for a current constriction element by means of oxidation, a current constriction element may also be formed by decreasing the electrical conductivity by implantation, e.g. proton implantation, in the semiconductor body. In order to laterally limit the current flow in the semiconductor body, the semiconductor body may furthermore also be patterned in a region by means of etching into a reduced lateral dimension suitable for the respective threshold current density (mesa etching). The lateral current limiting can also be supported or obtained by means of a measure of this type. The further current constriction element 22 is preferably arranged around an intensity node 20. Scattering of radiation, which is not amplified in the active regions with increased probability on account of the scattering, at the current constriction element not serving for the generation of radiation can thus be reduced. The current constriction element 23 may, if appropriate, also be arranged around an intensity node (not illustrated).

In contrast to the exemplary embodiment in accordance with FIGS. 1 and 2, resonator end mirrors 11 and 12 embodied as resonator Bragg mirrors preferably have the same conduction type, in particular n-conducting. The absorption of radiation by free charge carriers in the Bragg mirror can thus be reduced in comparison with a p-conducting Bragg mirror. In order that the electrical linking of the resonator Bragg mirror 11 to the semiconductor region 10*a*, which preferably has a different conduction type from that of the resonator Bragg mirror, is not impaired by means of a pn junction that is reverse-biased during operation of the component, for instance between the semiconductor regions 9*c* and 10*a*, with a high potential barrier, an additional tunnel junction 21 is arranged between the resonator Bragg mirror 11 and the active region 4*a* closest to the latter. Said additional tunnel junction may be embodied in a manner corresponding to the tunnel junction 5.

As an alternative, the resonator Bragg mirrors 11 and 12 may also have different conduction types. In this case, the further tunnel junction 21 and preferably the semiconductor region 9*c* may be dispensed with. The current constriction element 22 is then preferably integrated in the, in particular p-conducting, resonator Bragg mirror 11, particularly preferably on that side of the latter which faces the active region 4*a*. The formation of the current constriction elements in layers of the respective Bragg mirror 11 and 8 which preferably have identical conduction types and/or the same composition is thus facilitated.

Figure 4:
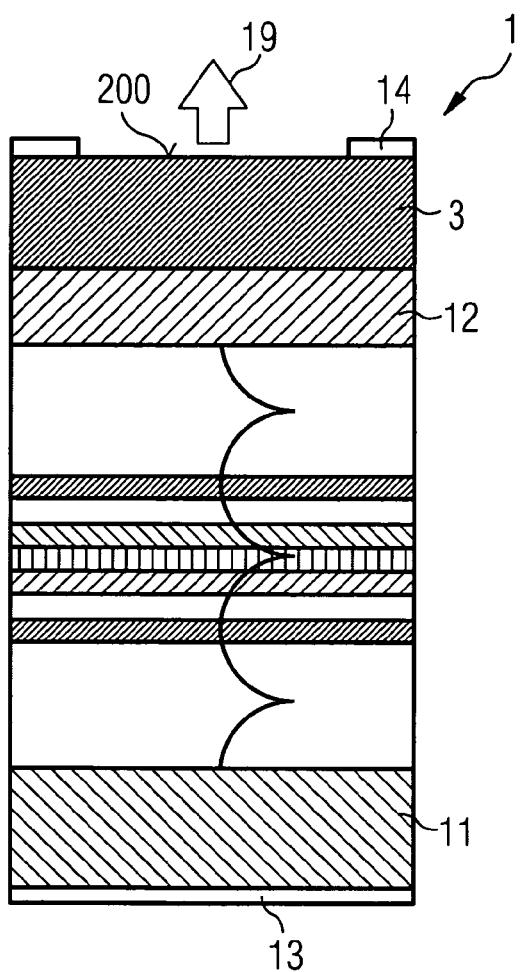
FIG. 4 shows a schematic sectional view of a third exemplary embodiment of a semiconductor component according to the invention.

FIG. 4 shows a schematic sectional view of a third exemplary embodiment of a semiconductor component 1 according to the invention. The semiconductor component shown in FIG. 4 essentially corresponds to the semiconductor component described in connection with FIGS. 1 and 2. In contrast thereto, the semiconductor component is formed as a so-called bottom emitter. The radiation 19 thus leaves the semiconductor body 2 via that side of the semiconductor body which faces the substrate 3, and passes through the region of the substrate 3. The latter is preferably embodied in radiation-transmissive fashion for this purpose. In this case, the resonator end mirror 12 facing the substrate 3 expediently serves as the coupling-out mirror. If appropriate, the substrate 3 may also be removed or thinned—completely or in regions—for the passage of radiation. The second contact 14 is preferably embodied as a ring contact for the passage of radiation in a manner corresponding to the first contact 13 in accordance with FIG. 1. The second resonator end mirror 12, as the coupling-out mirror, expediently has a lower reflectivity than the resonator end mirror 11.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

In particular, the invention is not to be regarded as restricted to a semiconductor component comprising only two active regions. Rather, it is also possible to provide a larger number of active regions, preferably in a common resonator. Said active regions are preferably electrically conductively connected in series in each case in pairs by means of a tunnel junction arranged between two respective active regions, if appropriate in each case with a frequency-selective element surrounding the tunnel junction. By way of example, up to ten active regions may be provided. In this way, the efficiency of the semiconductor component may be increased more extensively, if appropriate.

Furthermore, a one- or two-dimensional, linear or areal, preferably matrix like, arrangement of semiconductor components may also be regarded as encompassed by the invention. This arrangement is preferably embodied in monolithically integrated fashion, that is to say by means of epitaxial growth of a semiconductor layer sequence for the semiconductor bodies of the various semiconductor components and preferably formation of the components on a single growth substrate. This makes it possible to concentrate a multiplicity of semiconductor components on a small space with a small spacing.

We claim:

1. A surface emitting semiconductor component with an emission direction, which comprises a semiconductor body comprising a plurality of active regions which are suitable for the generation of radiation and are spaced apart from one another in the emission direction, and a frequency-selective element formed in the semiconductor body, wherein the frequency-selective element includes two Bragg-minors, the frequency-selective element is arranged between two adjacent active regions of the plurality of active regions, a tunnel junction is arranged between said two Bragg-minors, the reflectivity of each of said two Bragg-minors is greater than 40% and less than 80%, the semiconductor component includes a resonator which is not formed by said two Bragg-mirrors, and a radiation field that forms within said resonator during operation of the semiconductor component has an intensity minimum within the tunnel junction.

2. The semiconductor component as claimed in claim 1, wherein the tunnel junction is monolithically integrated in the semiconductor body between the two adjacent active regions of the plurality of active regions and the two adjacent active regions are electrically conductively connected by means of the tunnel junction during operation of the semiconductor component.

3. The semiconductor component as claimed in claim 2, wherein the tunnel junction is surrounded by the frequency-selective element.

4. The semiconductor component as claimed in claim 1, wherein the two Bragg minors have different conduction types.

5. The semiconductor component as claimed in claim 1, wherein the frequency-selective element is monolithically integrated in the semiconductor body.

6. The semiconductor component as claimed in claim 1, wherein a current constriction element is formed between the two adjacent active regions of the plurality of active regions.

7. The semiconductor component as claimed in claim 1, wherein the resonator is at least one of an internal resonator and an external resonator, and if the resonator is the external resonator then the semiconductor component is formed for operation with the external resonator.

8. The semiconductor component as claimed in claim 7, wherein the two adjacent active regions of the plurality of active regions are arranged as amplifying regions within the resonator and the resonator is formed as a common resonator for both of the two adjacent active regions.

9. The semiconductor component as claimed in claim 1, wherein the semiconductor component is an electrically pumped semiconductor laser component.

10. The semiconductor component as claimed in claim 1, wherein the semiconductor component is formed as a VCSEL.

11. The semiconductor component as claimed in claim 7, wherein the resonator is formed by means of a first resonator mirror and a second resonator minor.

12. The semiconductor component as claimed in claim 11, wherein a pump current for electrical pumping flows through at least one of the first resonator minor and the second resonator minor.

13. The semiconductor component as claimed in claim 11, wherein at least one of the first resonator mirror and the second resonator mirror is a Bragg minor.

14. The semiconductor component as claimed in claim 13, wherein at least one of the resonator mirrors is doped.

15. The semiconductor component as claimed in claim 13, wherein the resonator mirrors are configured to have one of a identical conduction type and a different conduction type.

16. The semiconductor component as claimed in claim 13, wherein both resonator mirrors are n-conducting.

17. The semiconductor component as claimed in claim 1, wherein the two adjacent active regions of the plurality of active regions comprise a quantum well structure.

18. The semiconductor component as claimed in claim 2, wherein the tunnel junction includes two tunnel semiconductor layers of different conduction types.

19. The semiconductor component as claimed in claim 1, wherein the semiconductor body comprises a III-V semiconductor material, in particular a material from the III-V semiconductor material systems $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$.

20. The semiconductor component as claimed in claim 1, wherein the semiconductor body contains a III-V semiconductor material, in particular a material from the III-V semiconductor material systems InGaAsN, InGaAsSb, InGaAsSbN or $In_xGa_{1-x}As_yP_{1-y}$, where $0 \leq x \leq 1$ and $0 \leq y \leq 1$.

* * * * *

UNITED STATES PATENT AND TRADEMARK OFFICE
CERTIFICATE OF CORRECTION

PATENT NO. : 7,856,045 B2
APPLICATION NO. : 11/634708
DATED : December 21, 2010
INVENTOR(S) : Marc Philippens It is certified that error appears in the above-identified patent and that said Letters Patent is hereby corrected as shown below:

Column 16, lines 47-65, Claim 1 should read

1. A surface emitting semiconductor component with an emission direction, which comprises a semiconductor body comprising a plurality of active regions which are suitable for the generation of radiation and are spaced apart from one another in the emission direction, and a frequency-selective element formed in the semiconductor body, wherein the frequency-selective element includes two Bragg-mirrors, the frequency-selective element is arranged between two adjacent active regions of the plurality of active regions, a tunnel junction is arranged between said two Bragg-mirrors, the reflectivity of each of said two Bragg-mirrors is greater than 40% and less than 80%, the semiconductor component includes a resonator which is not formed by said two Bragg-mirrors, and a radiation field that forms within said resonator during operation of the semiconductor component has an intensity minimum within the tunnel junction.

Column 17, lines 9-11, Claim 4 should read

4. The semiconductor component as claimed in claim 1, wherein the two Bragg mirrors have different conduction types.

Column 18, lines 1-3, Claim 11 should read

11. The semiconductor component as claimed in claim 7, wherein the resonator is formed by means of a first resonator mirror and a second resonator mirror.

Signed and Sealed this
Thirty-first Day of July, 2012

David J. Kappos
*Director of the United States Patent and Trademark Office*

CERTIFICATE OF CORRECTION (continued)
U.S. Pat. No. 7,856,045 B2

Column 18, lines 4-7, Claim 12 should read

12. The semiconductor component as claimed in claim 11, wherein a pump current for electrical pumping flows through at least one of the first resonator <u>mirror</u> and the second resonator <u>mirror</u>.

Column 18, lines 8-10, Claim 13 should read

13. The semiconductor component as claimed in claim 11, wherein at least one of the first resonator mirror and the second resonator mirror is a Bragg <u>mirror</u>.